(12) United States Patent
Hu et al.

US012100598B2

(10) Patent No.: US 12,100,598 B2
(45) Date of Patent: Sep. 24, 2024

(54) METHODS FOR PLANARIZING A SUBSTRATE USING A COMBINED WET ETCH AND CHEMICAL MECHANICAL POLISHING (CMP) PROCESS

(71) Applicant: Tokyo Electron Limited, Tokyo (JP)

(72) Inventors: Shan Hu, Albany, NY (US); Eric Chih-Fang Liu, Albany, NY (US); Henan Zhang, Albany, NY (US); Sangita Kumari, Albany, NY (US); Peter Delia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 184 days.

(21) Appl. No.: 17/942,369

(22) Filed: Sep. 12, 2022

(65) Prior Publication Data

US 2024/0087907 A1    Mar. 14, 2024

(51) Int. Cl.
*H01L 21/3105* (2006.01)

(52) U.S. Cl.
CPC .............................. *H01L 21/31055* (2013.01)

(58) Field of Classification Search
None
See application file for complete search history.

(56) References Cited

U.S. PATENT DOCUMENTS

| | | | |
|---|---|---|---|
| 3,979,241 A | 9/1976 | Maeda et al. | |
| 5,953,578 A | 9/1999 | Lee | |
| 6,787,056 B2 | 9/2004 | Tsai et al. | |
| 9,865,598 B1 * | 1/2018 | Bi | H01L 21/31144 |
| 2015/0357189 A1 * | 12/2015 | Davis | H01L 29/1606 |
| | | | 257/29 |
| 2018/0138053 A1 | 5/2018 | Yao et al. | |
| 2021/0265172 A1 * | 8/2021 | Fu | H01L 21/76883 |
| 2021/0407794 A1 * | 12/2021 | Chang | H01L 21/0337 |
| 2022/0098485 A1 | 3/2022 | Vereecke | |
| 2022/0130722 A1 * | 4/2022 | Parikh | H01L 21/76816 |

OTHER PUBLICATIONS

Ueda, "Effect Of Hydrophobicity And Surface Potential Of Silicon On SiO2 Etching In Nonometer-Sized Narrow Spaces", Trans Tech Publications, 2021, 6 pgs.

(Continued)

*Primary Examiner* — Shamim Ahmed
(74) *Attorney, Agent, or Firm* — Egan, Enders & Huston LLP.

(57) ABSTRACT

The present disclosure combines chemical mechanical polishing (CMP), wet etch and deposition processes to provide improved processes and methods for planarizing an uneven surface of a material layer deposited over a plurality of structures formed on a substrate. A CMP process is initially used to smooth the uneven surface and provide complete local planarization of the material layer above the plurality of structures. After achieving complete local planarization, a wet etch process is used to etch the material layer until a uniform recess is formed between the plurality of structures and the material layer is provided with a uniform thickness across the substrate. In some embodiments, an additional material layer may be deposited and a second CMP process may be used to planarize the additional material layer to provide the substrate with a globally planarized surface.

21 Claims, 10 Drawing Sheets

(56) References Cited

OTHER PUBLICATIONS

Watanabe et al., "High Selectively (SiN/SiO2) Etching Using An Organic Solution Containing Anhydroud HF", Microelectronic Engineering, 2009, 1 pg.
Okuyama et al., "Impact Of Electrostatic Effects On Wet Etching Phenomenon In Nanoscale Region", Trans Tech Publications, 2015, 5 pgs.
Polster et al., "The Electrical-Double Layer Revisted", Natural Sciences, Dec. 2021, 10 pgs.
Zubel et al., "Silicon Anisotropic Etching In Alkaline Solutions IV: The Effect Of Organic And Inorganic Agents On Silicon Anisotropic Etching Process", Sensors And Actuators A Physical, Jan. 2001, 1 pg.
MicroChemicals, "Wet-Chemical Etching Of Silicon and Sio2", Anisotropic Etching Of Silicon, Basics Of Microstructuring, Obtained from Internet Jul. 12, 2022, 7 pgs.
MicroChemicals, "Wet Chemical Etching—Basics", Basics Of Microstructuring, Obtained from Internet Jul. 12, 2022, 8 pgs.
Virginia Semiconductor, "Wet-Chemical Etching And Cleaning Of Silicon", Jan. 2003, 11 pgs.
Li et al., "Evaluation On Dispersion Behavior Of The Aqueous Copper Nano-Suspensions", Journal Of Colloid And Interface Science, Mar. 2007, 9 pgs.

\* cited by examiner (a) Provide a substrate having a plurality of features (b) Deposit a first material layer (c) CMP the first material layer to provide complete local planarization (d) Wet etch the first material layer (e) Continue wet etch to provide a uniform recess between the structures and a uniform thickness of the first material layer across the substrate (f) Deposit a second material layer (g) CMP the second material layer to provide complete global planarization

METHODS FOR PLANARIZING A SUBSTRATE USING A COMBINED WET ETCH AND CHEMICAL MECHANICAL POLISHING (CMP) PROCESS

BACKGROUND

The present disclosure relates to the processing of substrates. In particular, the present disclosure provides improved processes and methods for planarizing substrates.

Semiconductor device formation typically involves a series of manufacturing techniques related to the formation, patterning, and removal of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching).

Wet etching generally involves dispensing a chemical solution over the surface of a substrate or immersing the substrate in the chemical solution. The chemical solution (otherwise referred to herein as an etch solution) often contains a solvent and etchant chemical(s) designed to react with materials on the substrate surface and promote dissolution of the reaction products. As a result of exposure of the substrate surface to the etch solution, material is removed from the substrate. The composition and temperature of the etch solution may be controlled to control the etch rate, specificity, and residual material on the surface of the substrate post-etch.

Chemical-mechanical polishing (CMP) has become an indispensable tool for planarization in semiconductor manufacturing. CMP uses a slurry containing a solvent, an abrasive grit, and reactive chemicals designed to corrode the surface being polished. The combination of surface reaction and action of the abrasive grit leads to enhanced material removal at elevated points on the surface. Thus, CMP is commonly used to planarize a substrate having an uneven surface.

FIG. 8 illustrates an example CMP process 10 that may be used to planarize an uneven surface of a material layer formed on a substrate. In the example process shown in FIG. 8, a substrate includes a plurality of structures 20 formed on underlying layer 30. A wide variety of semiconductor processes may be used to form the structures 20 on the underlying layer 30. A material 40 is deposited onto the substrate and the plurality of structures 20. A wide variety of semiconductor processes may be used to deposit the material 40. For example, the material 40 may be deposited by spin-on, chemical vapor deposition (CVD), physical vapor deposition (PVD), etc. When the material 40 is deposited onto the substrate, an uneven surface 50 is produced in step (a) of FIG. 8 due to the structures 20 formed on the underlying layer 30. As shown in FIG. 8, the initial step height (h) of the uneven surface 50 in the vicinity of the structures 20 may be substantially equal to the height, or thickness (t), of the structures 20.

In ideal situations, the CMP process 10 shown in FIG. 8 can be used to achieve complete global planarization of the substrate surface. At the beginning of the process, the abrasive grit and reactive chemicals begin smoothing the uneven surface 50 in step (b) of FIG. 8, which reduces the step height (h) of the uneven surface 50. As the CMP process 10 progresses, the process may achieve complete local planarization 60 of the uneven surface 50 in step (c) and near global planarization 70 of the uneven surface 50 in step (d) before achieving complete global planarization 80 in step (e). By steadily removing material at elevated points on the uneven surface 50, the CMP process 10 gradually reduces the step height (h) of the uneven surface 50 during steps (b), (c) and (d) until the step height (h) is eliminated and complete global planarization 80 is achieved in step (e).

Some applications may require a uniform recess 90 to be formed between the structures 20, as shown in step (f) of FIG. 8. In some cases, a dry etch or wet etch process may be used to form a uniform recess 90 between the structures 20 after achieving complete global planarization 80 of the uneven surface. Unfortunately, the CMP process 10 shown in FIG. 8 illustrates an ideal CMP process. Although illustrated in FIG. 8, it is often difficult to achieve complete global planarization 80 of an uneven surface in practice. Without complete global planarization 80, a uniform recess 90 cannot be achieved.

SUMMARY

The present disclosure provides various embodiments of improved processes and methods to planarize a substrate. More specifically, the present disclosure provides improved processes and methods that combine chemical mechanical polishing (CMP), wet etch and deposition processes to planarize an uneven surface of a material layer deposited over a plurality of structures formed on a substrate.

In one example embodiment, the techniques described herein may be used to planarize an uneven surface of a material layer that is generated by: (a) forming a plurality of structures that extend above a surface of the substrate, where the plurality of structures are each separated by a gap, which has a critical dimension (CD) that is small compared to surrounding areas of the substrate, and (b) depositing a first material onto a surface of the substrate, the plurality of structures and within the gaps formed between the plurality of structures, so as to form a first material layer having an uneven surface. In such an embodiment, a first CMP process may be used to smooth the uneven surface and provide complete local planarization of the first material layer above the plurality of structures. After achieving complete local planarization, a wet etch process may be used to etch the first material layer until a uniform recess is formed between the plurality of structures and the first material layer is provided with a uniform thickness across the substrate.

In some embodiments of the present disclosure, a second material may be deposited onto the first material layer, the plurality of structures and within the gaps formed between the plurality of structures to form a second material layer having an elevated surface above the plurality of structures. After the second material is deposited, a second CMP process may be used to planarize the elevated surface of the second material layer, thus providing the substrate with a globally planarized surface.

In the embodiments disclosed herein, a wet etch process is utilized after CMP to etch the first material layer until a uniform recess is formed between the plurality of structures and the first material layer is provided with a uniform thickness across the substrate. During the wet etch process, the substrate is exposed to an etch solution, which reacts with the first material layer and promotes dissolution of reaction products to remove the first material from the substrate. When etching material within the gaps formed between the plurality of structures, the rate at which the material is removed from the gaps (i.e., the etch rate) may differ depending on a variety of factors, such as the CD of the gaps, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate within the gaps, and across more planar areas of the substrate, is known in the art as CD-dependent etching.

The present disclosure takes advantage of the CD-depending etching that occurs when etching material deposited within gaps (and other features, such as trenches, holes, slits, etc., having relatively small CD) formed between a plurality of structures (such as lines, layers, fins, etc.) and when etching material deposited across more planar areas of a substrate. The wet etch process described in the present disclosure may use an aqueous-based etch solution or a non-aqueous organic-based etch solution to etch the first material layer, depending on a surface potential of the wall material used to form the plurality of structures. As used herein, an aqueous-based etch solution is one that includes one or more etchant chemicals and an aqueous solvent. A non-aqueous organic-based etch solution, on the other hand, includes one or more etchant chemicals and an organic solvent.

According to one embodiment, a method is provided to form uniform recesses between a plurality of structures formed on a substrate. The method may begin, in some embodiments, by providing the substrate having a plurality of structures formed thereon, wherein the plurality of structures extend above a surface of the substrate, wherein the plurality of structures are each separated by a gap, and wherein a critical dimension (CD) of the gap is small compared to surrounding areas of the substrate. Next, the method may include depositing a material onto a surface of the substrate, the plurality of structures and within the gaps formed between the plurality of structures, wherein said depositing forms a material layer with an uneven surface. In some embodiments, said depositing may include depositing an oxide material or a dielectric material onto the surface of the substrate, the plurality of structures and within the gaps formed between the plurality of structures.

After forming the material layer with the uneven surface, the method may include planarizing the uneven surface of the material layer with a chemical mechanical polishing (CMP) process to provide the material layer with a locally planarized surface above the plurality of structures, and etching the material layer with an etch solution after said planarizing, wherein etching removes the material deposited within the gaps faster than the material is removed from the surrounding areas of the substrate. The method may continue said etching until a uniform recess is formed between the plurality of structures and the material layer is provided with a uniform thickness across the substrate.

In some embodiments, a wall material of the plurality of structures may exhibit a negative surface potential when exposed to aqueous solutions in a given pH range. For example, the wall material may include amorphous silicon (a-Si), polysilicon (poly-Si), silicon carbon nitride (SiCN) or silicon oxynitride (SiON). In such embodiments, said etching may include etching the material layer with a non-aqueous organic-based etch solution that includes one or more etchant chemicals and an organic solvent.

The non-aqueous organic-based etch solution may include a wide variety of etchant chemicals and organic solvents. For example, the one or more etchant chemicals may include at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may include one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

In other embodiments, a wall material of the plurality of structures may exhibit a positive surface potential when exposed to aqueous solutions in a given pH range. For example, the wall material may include silicon nitride (SiN). In such embodiments, said etching may include etching the material layer with an aqueous-based etch solution that includes one or more etchant chemicals and an aqueous solvent.

The aqueous-based etch solution may include a wide variety of etchant chemicals mixed with water. For example, the one or more etchant chemicals may include at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

According to another embodiment, a method is provided herein for planarizing a substrate. The method may begin, in some embodiments, by providing a substrate having a plurality of structures formed thereon, wherein the plurality of structures extend above a surface of the substrate, wherein the plurality of structures are each separated by a gap, and wherein a critical dimension (CD) of the gap is small compared to surrounding areas of the substrate. Next, the method may include depositing a first material onto a surface of the substrate, the plurality of structures and within the gaps formed between the plurality of structures, wherein said depositing forms a first material layer with an uneven surface.

After forming the first material layer with the uneven surface, the method may include planarizing the uneven surface of the first material layer with a chemical mechanical polishing (CMP) process to provide the first material layer with a locally planarized surface above the plurality of structures, and etching the first material layer with an etch solution after said planarizing, wherein said etching removes the first material deposited within the gaps faster than the first material is removed from the surrounding areas of the substrate. The method may continue said etching until a uniform recess is provided between the plurality of structures and the first material layer is provided with a uniform thickness across the substrate.

After etching the first material layer, as described above, the method may further include depositing a second material onto the first material layer, the plurality of structures and within the gaps formed between the plurality of structures, wherein said depositing forms a second material layer with an elevated surface above the plurality of structures, and planarizing the elevated surface of the second material layer with a chemical mechanical polishing (CMP) process to provide the second material layer with a globally planarized surface.

In some embodiments, said depositing the first material may include depositing an oxide material or a dielectric material onto the surface of the substrate, the plurality of structures and within the gaps formed between the plurality of structures. Likewise, said depositing the second material may include depositing an oxide material or a dielectric material onto the first material layer, the plurality of structures and within the gaps formed between the plurality of structures. In some embodiments, the second material may be the same as the first material. In other embodiments, the first material and the second material may be different.

In some embodiments, a wall material of the plurality of structures may exhibit a negative surface potential when exposed to aqueous solutions in a given pH range. For example, the wall material comprises amorphous silicon (a-Si), polysilicon (poly-Si), silicon carbon nitride (SiCN) or silicon oxynitride (SiON). In such embodiments, said etching may include etching the first material layer with a non-aqueous organic-based etch solution that includes one or more etchant chemicals and an organic solvent.

As noted above, the non-aqueous organic-based etch solution may include a wide variety of etchant chemicals and organic solvents. For example, the one or more etchant chemicals may include at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may be selected from a group consisting of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

In other embodiments, a wall material of the plurality of structures may exhibit a positive surface potential in aqueous solutions having a given pH range. For example, the wall material may include silicon nitride (SiN). In such embodiments, said etching may include etching the first material layer with an aqueous-based etch solution that includes one or more etchant chemicals and an aqueous solvent.

The aqueous-based etch solution may include a wide variety of etchant chemicals mixed with water. For example, the one or more etchant chemicals may include at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
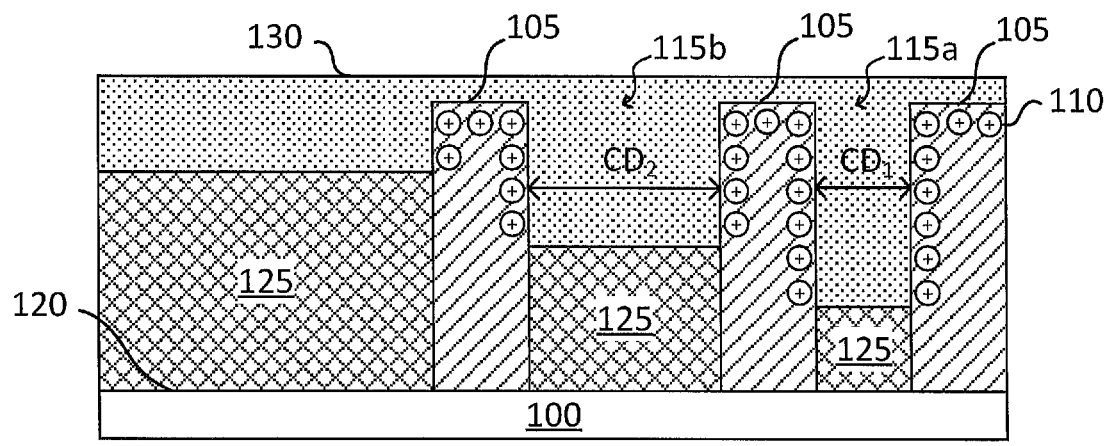
FIG. 1A is a cross-sectional view through a substrate having features of different critical dimension (CD) illustrating CD-dependent etching of material within the features when the substrate is exposed to a non-aqueous organic-based etch solution.

The present disclosure provides various embodiments of improved processes and methods to planarize a substrate. More specifically, the present disclosure provides improved processes and methods that combine chemical mechanical polishing (CMP), wet etch and deposition processes to planarize an uneven surface of a material layer deposited over a plurality of structures formed on a substrate.

In one example embodiment, the techniques described herein may be used to planarize an uneven surface of a material layer that is generated by: (a) forming a plurality of structures that extend above a surface of the substrate, where the plurality of structures are each separated by a gap, which has a critical dimension (CD) that is small compared to surrounding areas of the substrate, and (b) depositing a first material onto a surface of the substrate, the plurality of structures and within the gaps formed between the plurality of structures, so as to form a first material layer having an uneven surface. In such an embodiment, a first CMP process may be used to smooth the uneven surface and provide complete local planarization of the first material layer above the plurality of structures. After achieving complete local planarization, a wet etch process may be used to etch the first material layer until a uniform recess is formed between the plurality of structures and the first material layer is provided with a uniform thickness across the substrate.

In some embodiments of the present disclosure, a second material may be deposited onto the first material layer, the plurality of structures and within the gaps formed between the plurality of structures to form a second material layer having an elevated surface above the plurality of structures. After the second material is deposited, a second CMP process may be used to planarize the elevated surface of the second material layer, thus providing the substrate with a globally planarized surface.

In the embodiments disclosed herein, a wet etch process is utilized after CMP to etch the first material layer until a uniform recess is formed between the plurality of structures and the first material layer is provided with a uniform thickness across the substrate. During the wet etch process, the substrate is exposed to an etch solution, which reacts with the first material layer and promotes dissolution of reaction products to remove the first material from the substrate. When etching material within the gaps formed between the plurality of structures, the rate at which the material is removed from the gaps (i.e., the etch rate) may differ depending on a variety of factors, such as the CD of the gaps, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate within the gaps, and across more planar areas of the substrate, is known in the art as CD-dependent etching.

Figure 1B:
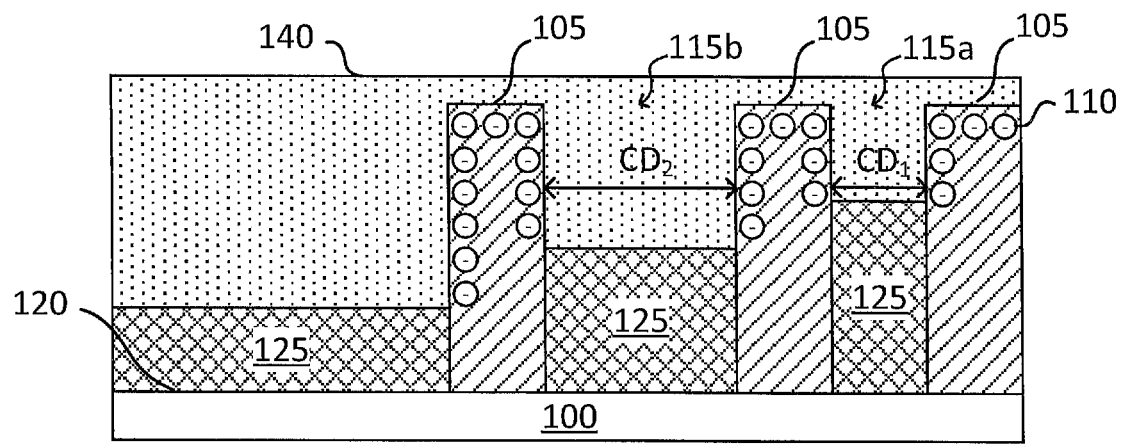
FIG. 1B is a cross-sectional view through a substrate having features of different critical dimension (CD) illustrating CD-dependent etching of material within the features when the substrate is exposed to an aqueous-based etch solution.
Figure 2:
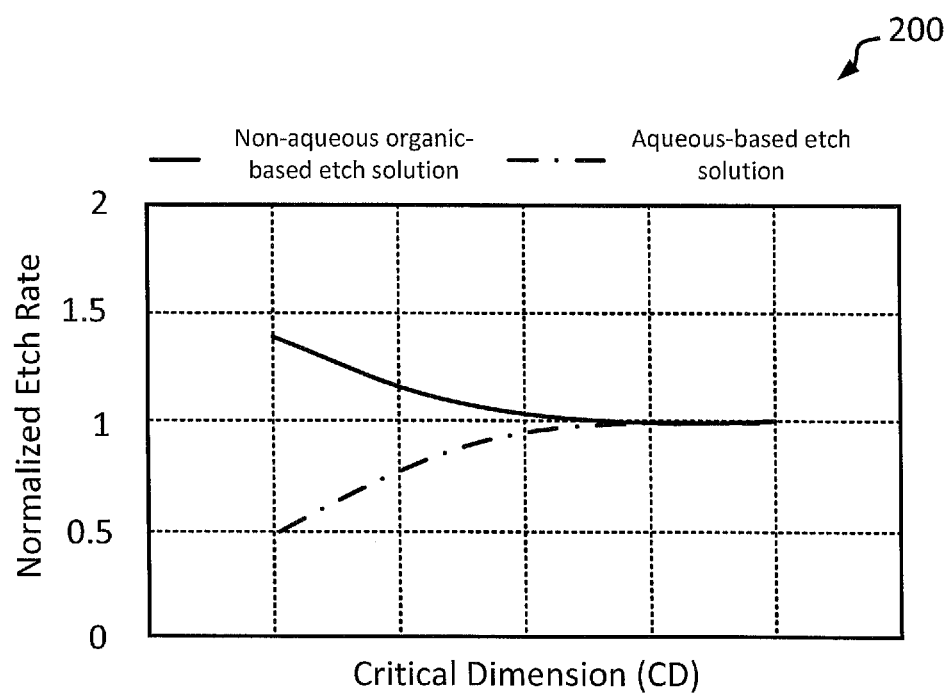
FIG. 2 is a graph illustrating normalized etch rate vs. feature CD when the substrate is exposed to a non-aqueous organic-based etch solution and an aqueous-based etch solution.

FIGS. 1A-1B and 2 illustrate CD-dependent etching of material deposited within features having different CD, and across more planar areas of a substrate, when the substrate is exposed to a non-aqueous organic-based etch solution 130 (FIGS. 1A and 2) and an aqueous-based solution 140 (FIGS. 1B and 2). As used herein, an aqueous-based etch solution 140 is a solution that includes one or more etchant chemicals mixed with an aqueous solvent (e.g., water ($H_2O$) or deionized water). A non-aqueous organic-based etch solution 130, on the other hand, is a solution that includes one or more etchant chemicals mixed with an organic solvent. In some embodiments, the non-aqueous organic-based etch solution 130 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The substrate 100 shown in FIGS. 1A-1B is provided with a plurality of structures 105 (e.g., metal lines, fins, etc.) that extend above a surface of the substrate. Each of the plurality of structures 105 is separated by a feature 115 (such as, e.g., a gap, trench, hole, etc.). A critical dimension (CD) of the features 115 may be the same (as shown, e.g., in FIG. 6(a)), or may be different, as shown in FIGS. 1A-1B. In the example embodiment shown in FIGS. 1A-1B, the substrate 100 is depicted as having a first feature 115a having a smaller CD ($CD_1$) and a second feature 115b having a larger CD ($CD_2$). The CD of the plurality of features 115 is relatively small (e.g., less than 100 nm) compared to the more planar areas 120 of the substrate 100 surrounding the plurality of structures 105.

A material 125 to be etched is deposited onto a surface of the substrate 100, the plurality of structures 105 and within the features 115 formed between the plurality of structures 105. The material 125 may include a wide variety of semiconductor materials. For example, the material 125 may be an oxide, a dielectric material, a silicon or a metal. In one example, the material 125 may be a silicon oxide (such as, e.g., silicon dioxide, $SiO_2$). Other oxide and dielectric materials, including low-k dielectric materials, may also be formed within the plurality of features 105 and etched.

In the embodiment shown in FIG. 1A, the substrate 100 is exposed to non-aqueous organic-based etch solution 130 that includes one or more etchant chemicals and an organic solvent. Examples of etchant chemicals that may be included within a non-aqueous organic-based etch solution 130 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

A wide variety of organic solvents may be used within the non-aqueous organic-based etch solution 130 described herein. Examples of organic solvents that may be included within the non-aqueous organic-based etch solution 130 include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_5H_{10}O_3$), ethanolamine ($C_2H_7NO$) and propylene glycol methyl ether acetate ($C_6H_{12}O_3$).

In some embodiments, the non-aqueous organic-based etch solution 130 may include an etchant chemical containing an anion as the main reactive species (e.g., hydrofluoric acid, ammonium hydroxide or hydrochloric acid) mixed with an alcohol (e.g., isopropyl alcohol, IPA), a polyhydric alcohol (e.g., ethylene glycol, EG), acetic acid, AA, or a ketone (e.g., propylene carbonate, PC). In at least one preferred embodiment, the non-aqueous organic-based etch solution 130 may include hydrofluoric acid mixed with IPA, AA, EG or PC. Other organic solvents described herein may also be mixed with hydrofluoric acid or other etchant chemicals (such as $NH_4OH$ or HCl) containing an anion as the main reactive species. Although the etchant chemicals described herein can be mixed with many different organic solvents, the compatibility and solubility of the etchant chemical(s) and organic solvent must be carefully considered.

When the substrate 100 is exposed to a non-aqueous organic-based etch solution 130 containing anions as the main reactive species, portions of the features 115 exposed to the non-aqueous organic-based etch solution 130 may exhibit a positive surface potential, as shown in FIG. 1A, depending on the pH of the etch solution and the wall material 110 used to form the features 115. For example, exposed portions of the features 115 may exhibit a positive surface potential (as shown in FIG. 1A) when the substrate 100 is exposed to a non-aqueous organic-based etch solution 130 containing hydrofluoric acid mixed with an organic solvent (e.g., IPA, AA, EG or PC) and the wall material 110 includes a silicon-containing material, such as amorphous silicon (a-Si), polysilicon (poly-Si), silicon nitride (SiN), silicon carbon nitride (SiCN) or silicon oxynitride (SiON).

When the substrate 100 is exposed to a non-aqueous organic-based etch solution 130, as shown in FIG. 1A and described above, the anions within the etchant chemical are attracted to the positively charged surface. This increases the local concentration of anions within the features 115, which increases the etch rate of the material 125 deposited within the features 115 compared to the more planar areas 120 of the substrate 100. Thus, the material 125 is etched faster within the plurality of features 115 and slower within the more planar areas 120 of the substrate 100 surrounding the plurality of structures 105. This is shown schematically in FIGS. 1A and 1n the graph 200 shown in FIG. 2. When features 115 of different CD are formed within the plurality of structures 105, as shown in FIG. 1A, the increase in etch rate is more pronounced within features having smaller CD (such as feature 115a) and less pronounced within features having larger CD (such as feature 115b). However, the etch rate within the features 115 is significantly faster than the etch rate achieved across the more planar areas 120 of the substrate 100.

In the embodiment shown in FIG. 1B, the substrate 100 is exposed to an aqueous-based etch solution 140 that includes one or more etchant chemicals and an aqueous solvent. As noted above, an aqueous-based etch solution 140 is a solution that includes an etchant chemical mixed with an aqueous solvent (e.g., water ($H_2O$) or deionized water). Examples of etchant chemicals that may be included within an aqueous-based etch solution 140 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

Figure 5:
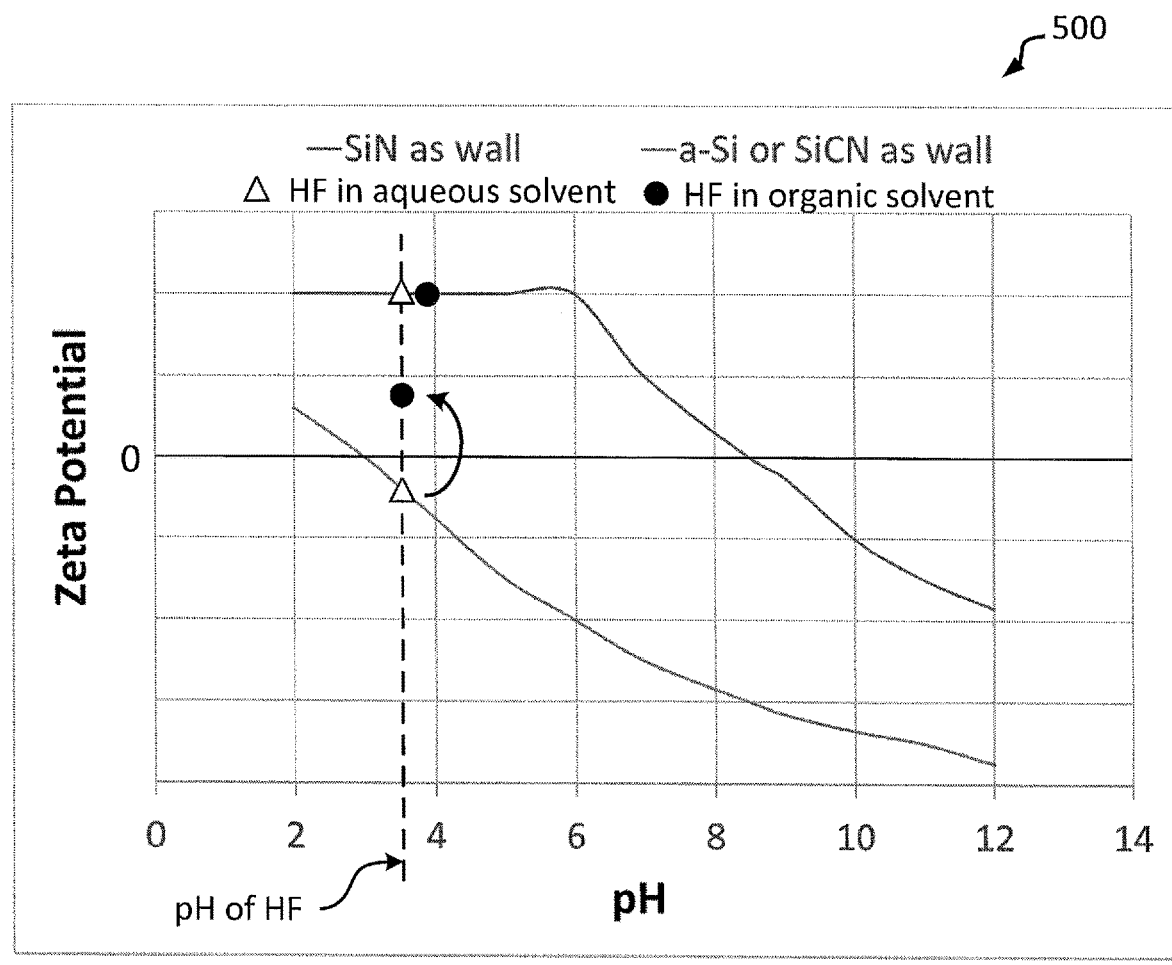
FIG. 5 is a graph illustrating Zeta potential vs pH for various etch solutions and wall materials.

When the substrate 100 is exposed to an aqueous-based etch solution 140 containing anions as the main reactive species, portions of the features 115 exposed to the aqueous-based etch solution 140 may exhibit a negative surface potential, as shown in FIG. 1B, depending on the pH of the etch solution and the wall material 110 used to form the features 115. For example, exposed portions of the features 115 may exhibit a negative surface potential (as shown in FIG. 1B) when the substrate 100 is exposed to an aqueous-based etch solution 140 containing hydrofluoric acid mixed with water and the wall material 110 includes a silicon-containing material, such as amorphous silicon (a-Si), polysilicon (poly-Si), silicon carbon nitride (SiCN) or silicon oxynitride (SiON). However, other silicon-containing materials, such as silicon nitride (SiN), may exhibit a positive surface potential (not shown in FIG. 1B) when the substrate 100 is exposed to an aqueous-based etch solution 140 containing hydrofluoric acid mixed with water. This is shown in FIG. 5 and described in more detail below.

When the substrate 100 is exposed to an aqueous-based etch solution 140, as shown in FIG. 1B, the negative surface potential of the wall material 110 repels the anions within the etchant chemical to decrease its local concentration in the features 115, and thus, decreases the etch rate of the material 125 deposited within the features 115. When features 115 of different CD are formed within the plurality of structures 105, as shown in FIG. 1B, the decrease in etch rate is more pronounced in features having smaller CD (such as feature 115a) and less pronounced in features having larger CD (such as feature 115b). As a result, the material 125 is etched slower in features having smaller CD (such as feature 105a) and faster in features having larger CD (such as feature 105b). As shown in FIG. 1B, the etch rate across the more planar areas 120 of the substrate is significantly faster than the etch rate within the features 115.

When etching the material 125 formed within the plurality of features 115, the etch rate of the material 125 may depend on a variety of factors, including the critical dimension (CD) of the features 115, the particular etchant chemical(s) and/or reactive species used within the etch solution, the particular solvent used within the etch solution, the ratio of etchant chemical(s) to solvent used within the etch solution and/or the pH of the etch solution. In addition to these factors, the electric potential of the wall material 110 adjacent to the material 125 being etched may also affect the etch rate of the material 125, depending on the etch solution used.

As shown in FIGS. 1A-1B and 2, non-aqueous organic-based etch solutions 130 and aqueous-based etch solutions 140 may sometimes have the opposite effect on etch rate. When a non-aqueous organic-based etch solution 130 is used to etch the material 125, the etch rate is increased within features of smaller CD (such as feature 115a) and decreased within features of larger CD (such as feature 115b). However, the opposite is true when an aqueous-based etch solution 140 is used to etch the material 125. This may be due, at least in part, to the Zeta potential and the electric double layer (EDL) that exists between the wall material 110 and the etch solution.

Figure 3:
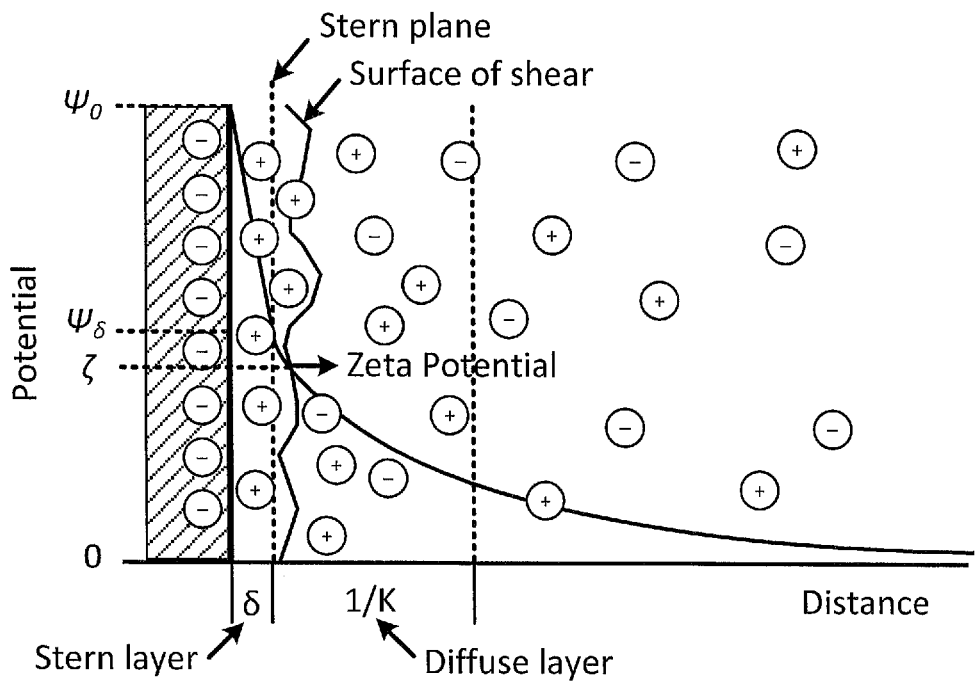
FIG. 3 is a schematic diagram illustrating the Zeta potential and the electric double layer (EDL) that exists between a charged wall surface and the etch solution.

FIG. 3 is a schematic diagram illustrating Zeta potential and the electric double layer that exists between the wall material and the etch solution. The etch solution includes cations (positively charged ions) and anions (negatively charged ions). When the etch solution comes in contact with a wall material having negative surface potential, as shown in FIG. 3, cations within the etch solution are attracted to and adsorbed onto the wall material by electrostatic and/or van der Walls forces. The opposite is true when the etch solution comes in contact with a wall material having positive surface potential (i.e., anions within the etch solution are attracted to and adsorbed onto the wall material). This attraction produces an electric double layer (i.e., a layer that does not satisfy electroneutrality) between the wall material and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 3, the electric potential ($\Psi$) near the wall surface changes linearly between $\Psi_0$ and $\Psi_s$ (the potential at the Stern plane) and decays exponentially with distance from $\Psi_\delta$ to zero in the Diffuse layer and beyond. The Zeta potential ($\zeta$) is the electric potential that exists at the Surface of Shear between the charged wall surface and the etch solution. The Zeta potential ($\zeta$) may be positive, zero or negative, depending on the wall material and the pH of the etch solution.

Figure 4:
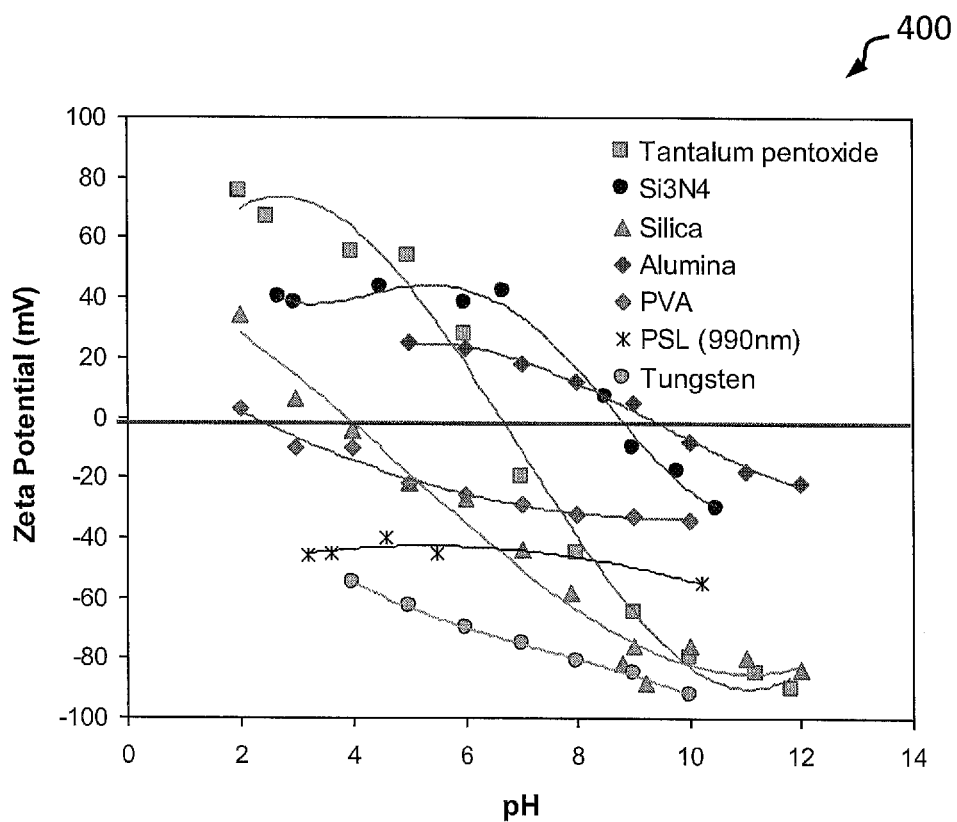
FIG. 4 is a graph illustrating Zeta potential vs pH for various wall materials.

FIG. 4 depicts a graph 400 illustrating Zeta potential (expressed in mV) vs pH for various wall materials. As shown in FIG. 4, the Zeta potential generally increases with decreasing pH and decreases with increasing pH. In some embodiments, the Zeta potential between the charged wall surface and the etch solution can be changed by changing the pH of the etch solution (e.g., by changing the etchant chemical(s) used within the etch solution, or by adding an acid or base to the etch solution), as shown in FIG. 4. In other embodiments, the Zeta potential between the charged wall surface and the etch solution can be changed by adding a surfactant to the etch solution. In yet other embodiments, the Zeta potential between the charged wall surface and the etch solution can be changed by utilizing an organic solvent, instead of an aqueous solvent, within the etch solution (depending on the pH of the etch solution). This is illustrated in the graph 500 shown in FIG. 5.

The graph 500 shown in FIG. 5 illustrates the Zeta potential vs pH for various etch solutions and wall materials (e.g., SiN, a-Si and SiCN). When hydrofluoric acid (HF) is mixed with an aqueous solvent and used as an etch solution, the Zeta potential (denoted with a A) between the etch solution and the wall material is: (a) negative for a-Si and SiCN (resulting in a negatively charged wall surface), and (b) positive for SiN (resulting in a positively charged wall surface). When hydrofluoric acid is mixed with organic solvent, instead of an aqueous solvent, the Zeta potential (denoted with a) is positive a-Si, SiCN and SiN (resulting in a positively charged wall surface). The graph 500 shown in FIG. 5 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions have on etch rate when etching features having different CD.

In the graph 500 shown in FIG. 5, an organic solvent is utilized within an HF etch solution to change the Zeta potential of a negatively charged a-Si or SiCN wall surface to a positive surface potential. However, the use of an organic solvent may not be enough to shift the Zeta potential from a negative surface potential to a positive surface potential for all wall surfaces. In some cases, the pH of an organic-based etch solution can be adjusted (e.g., by changing the etchant chemical(s) used within the etch solution, or by adding an acid or base to the etch solution) to further adjust the Zeta potential, thus achieving a positive surface potential and the desired CD-dependent etch results. If the pH cannot be changed (e.g., due to compatibility concerns), a surfactant can be added to the organic-based etch solution to adjust the Zeta potential and achieve the desired CD-dependent etch results. In some cases, all three methods (organic solvent, pH tuning and surfactant addition) can be used to provide or enhance the CD-dependent trend.

In the description provided above, organic-based etch solutions are used (with or without pH tuning and surfactant addition) to increase the etch rate of material formed within features having smaller CD when: (a) the organic-based etch solution contains anions as the main reactive species, and (b) the material being etched is adjacent to a wall material that exhibits a negative surface potential in aqueous solutions. However, organic-based etch solutions may not provide the desired CD-dependent etch results in all embodiments. In some embodiments, an aqueous-based etch solution may be used to increase the etch rate of material formed within features having smaller CD when cations are used as the main reactive species. In some embodiments, the pH may be adjusted and/or a surfactant may be added to an aqueous-based etch solution containing cations as the main reactive species to provide the desired CD-dependent etch results.

As described herein, one mechanism that may cause the variation in etch rates when using the various etch solutions, various wall materials, and various CDs is a mechanism related to surface potentials. However, the techniques described herein are not strictly limited to such techniques. Thus, the CD dependent etch rates described herein may be accomplished through other mechanisms and the etch rate advantages described and obtained with the techniques provided herein are not limited to the particular surface potential mechanisms. Rather, the advantages may be obtained utilizing other mechanisms also.

The present disclosure combines chemical mechanical polishing (CMP), wet etch and deposition processes to provide improved processes and methods for planarizing an uneven surface of a material layer formed on a substrate. As noted above, a CMP process may be initially used to smooth the uneven surface and provide complete local planarization of the material layer above the plurality of structures. After achieving complete local planarization, a wet etch process may be used to etch the material layer until a uniform recess is formed between the plurality of structures and the material layer is provided with a uniform thickness across the substrate.

In some embodiments of the present disclosure, a second material may be deposited onto the first material layer, the plurality of structures and within the gaps formed between the plurality of structures to form a second material layer having an elevated surface above the plurality of structures. After the second material is deposited, another CMP process may be used to planarize the elevated surface of the second material layer, thus providing the substrate with a globally planarized surface.

The wet etch process described in the present disclosure provides a uniform recess between the plurality of structures, and a uniform thickness of the material layer, by taking advantage of the CD-depending etching that occurs when etching material deposited within gaps (and other features, such as trenches, holes, slits, etc., having relatively small CD) formed between a plurality of structures (such as lines, layers, fins, etc.) and when etching material deposited across more planar areas of the substrate. The etch solution utilized within the wet etch process may be chosen based on a variety of factors, including but not limited to, the desired etch rate of the material layer, the CD of the gaps formed between the plurality of structures and the surface potential of the wall material adjacent to the material layer being etched.

Figure 6:
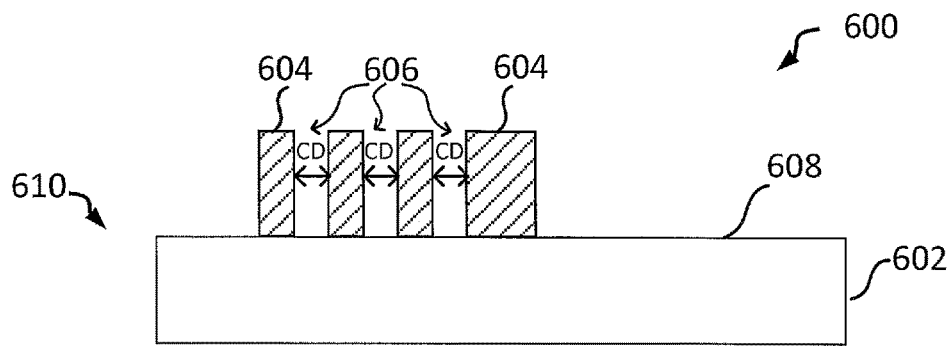
FIG. 6 illustrates one embodiment of an improved process that utilizes the techniques described herein to planarize an uneven surface of a material layer formed on a substrate.
Figure 6:
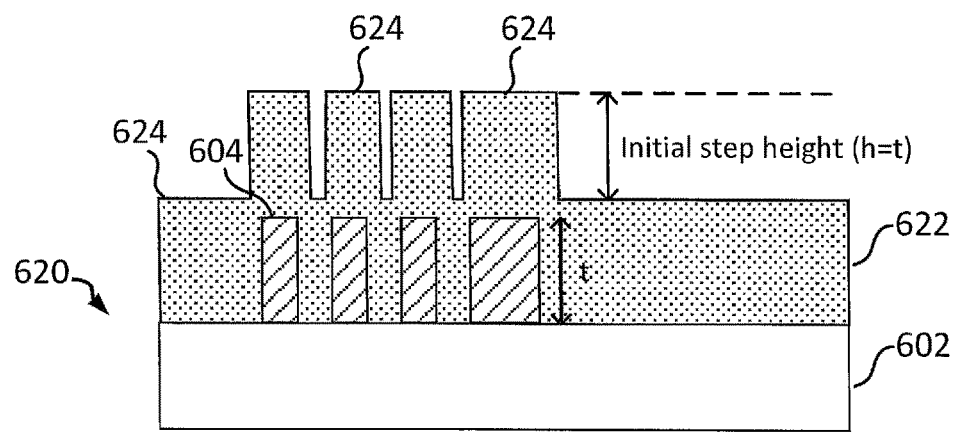
Figure 6:
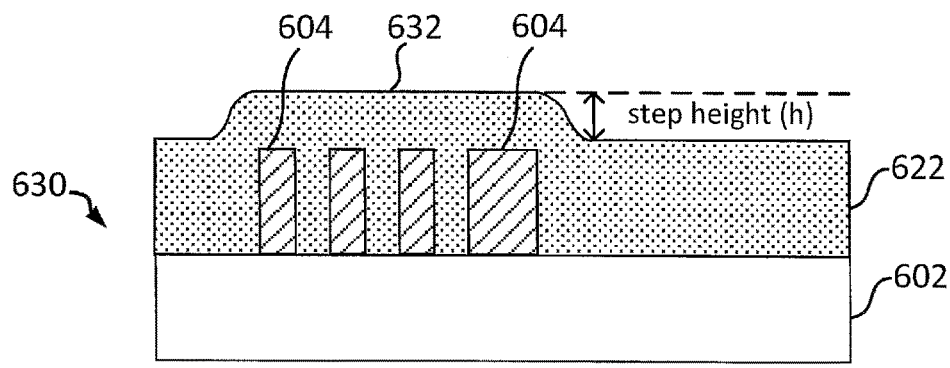
Figure 6:
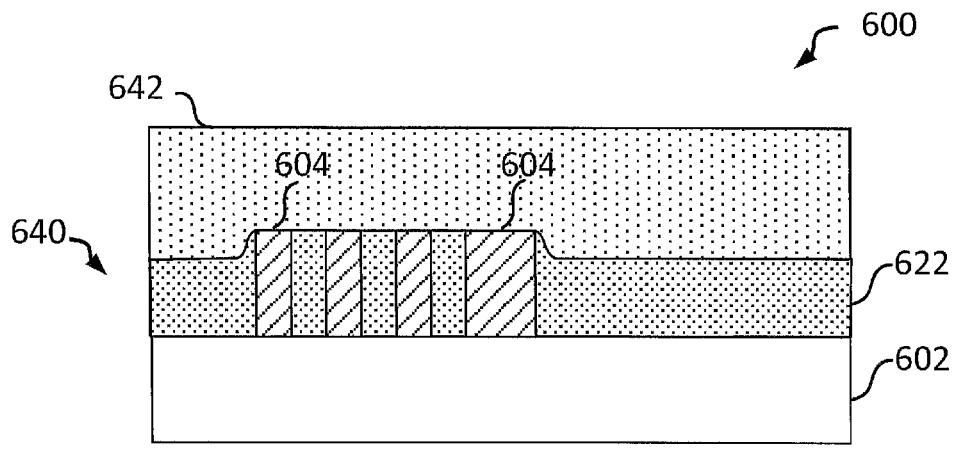
Figure 6:
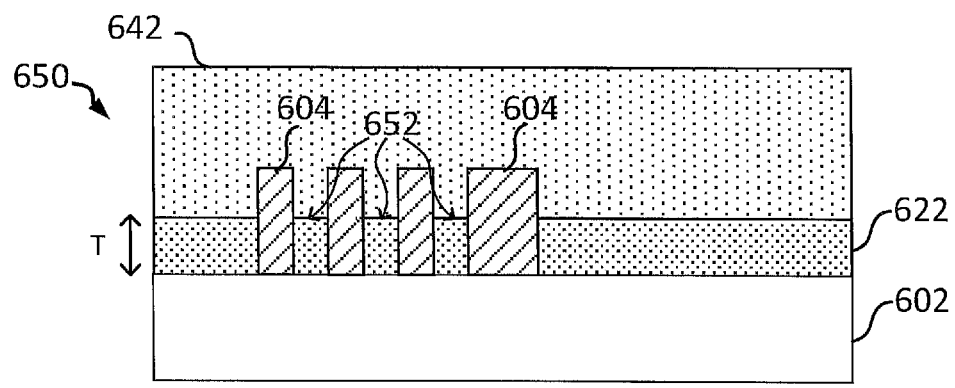
Figure 6:
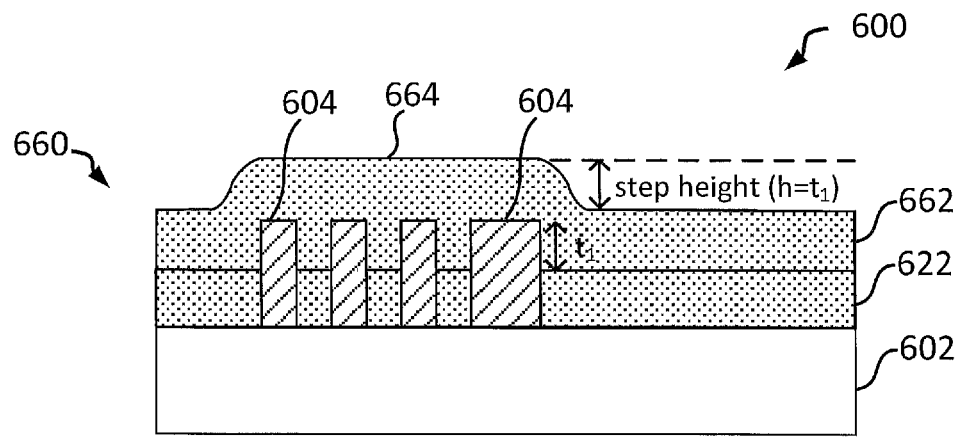
Figure 6:
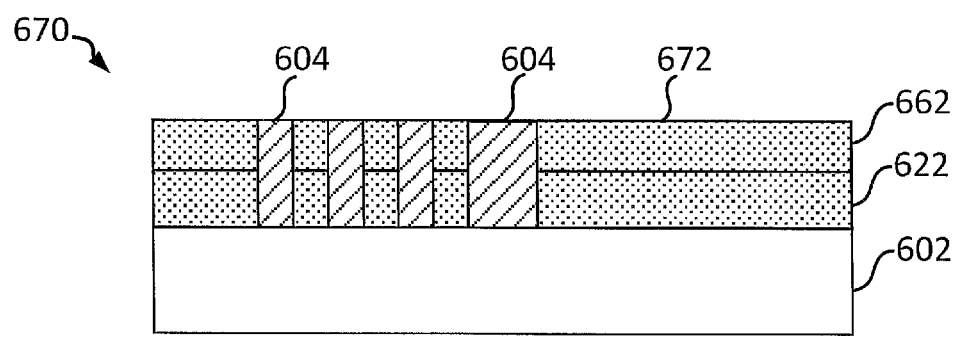
Figure 7:
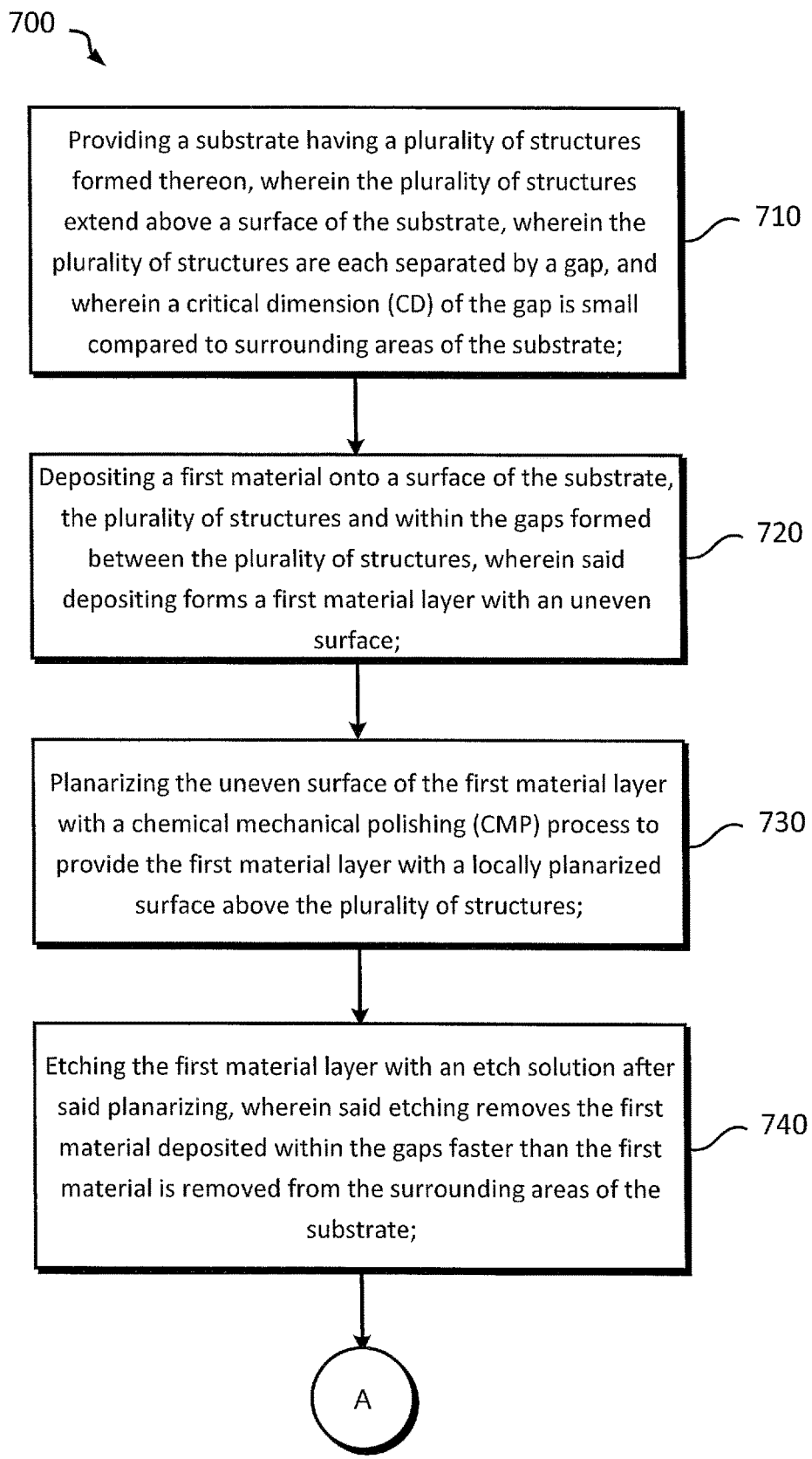
FIG. 7 is a flowchart diagram illustrating one embodiment of a method that utilizes the techniques described herein to planarize an uneven surface of a material layer formed on a substrate.
Figure 7:
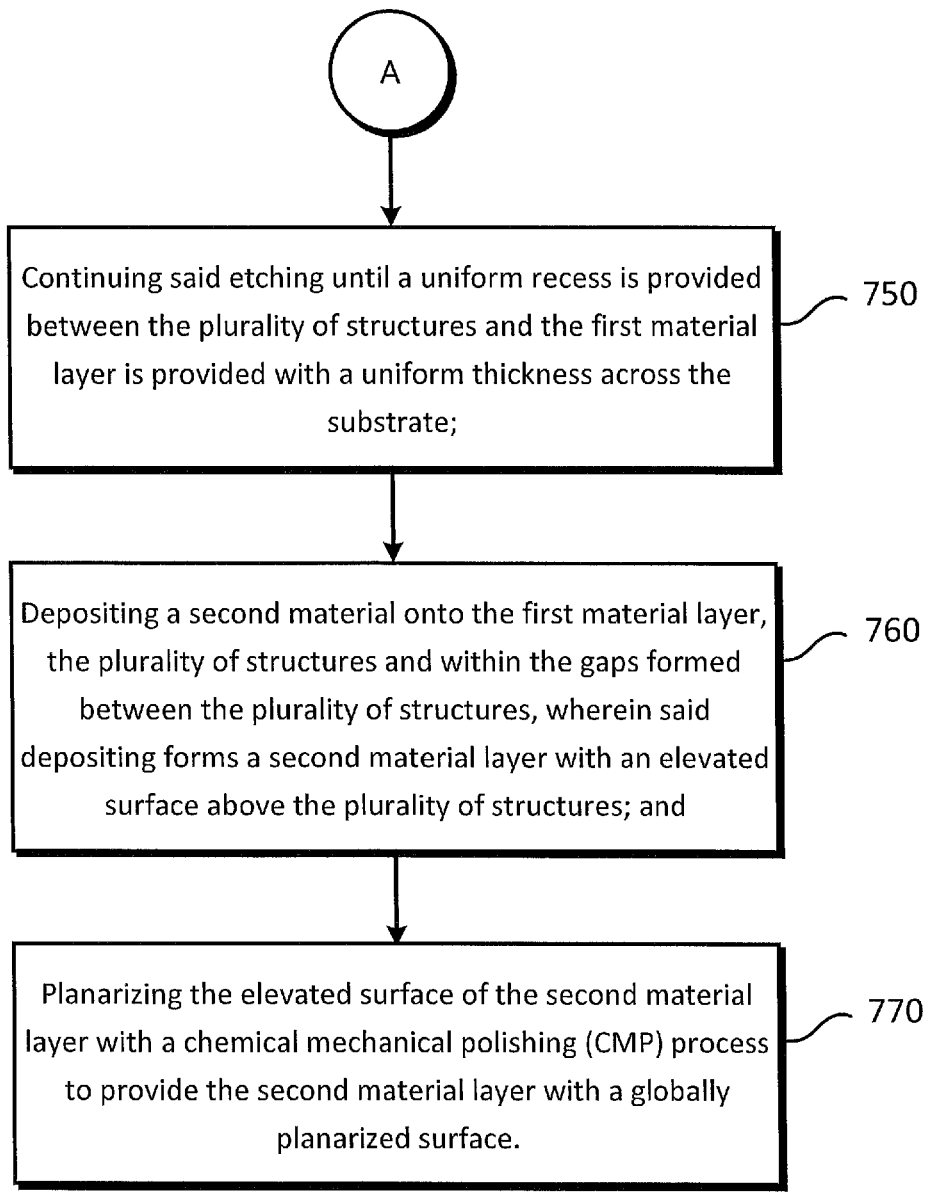

FIGS. 6 and 7 illustrate one embodiment of an improved process 600 and method 700 that combines chemical mechanical polishing (CMP), wet etch and deposition processes to planarize an uneven surface of a material layer formed on a substrate. It will be recognized that the embodiment shown in FIGS. 6-7 is merely exemplary and additional processes and methods may utilize the techniques described herein. Further, additional processing steps may be added to the embodiment shown in FIGS. 6-7, as the steps shown in the figures are not intended to be exclusive. Moreover, the order of the steps is not limited to the order shown in the figures, as different orders may occur and/or various steps may be performed in combination or at the same time.

In some embodiments, the improved process 600 and method 700 may begin by providing a substrate 602 having a plurality of structures 604 formed thereon (in step 610 of FIG. 6(a) and step 710 of FIG. 7). As shown in FIG. 6(a), the plurality of structures 604 extend above a surface of the substrate 602. Each of the plurality of structures 604 is separated by a gap 606. A critical dimension (CD) of the gap 606 is small compared to the more planar area 608 of the substrate adjacent to (or surrounding) the plurality of features 604. In some embodiments, the CD of the gaps 606 may be the same, as shown in FIG. 6(a). In other embodiments, the CD of the gaps 606 may be different as shown, e.g., in FIGS. 1A-1B.

Once a substrate is provided as shown in FIG. 6(a), the improved process 600 and method 700 may deposit a first material onto a surface of the substrate 602, the plurality of structures 604 and within the gaps 606 formed between the plurality of structures 604 (in step 620 of FIG. 6(b) and step 720 of FIG. 7). A wide variety of semiconductor processes may be used to deposit the first material in FIG. 6(b). For example, the first material may be deposited by spin-on, chemical vapor deposition (CVD), physical vapor deposition (PVD), etc. A wide variety of materials may be deposited in FIG. 6(b). For example, the first material may be an oxide or a dielectric, as noted above.

Regardless of the deposition process and the material deposited, the deposition step shown in FIG. 6(b) forms a first material layer 622 having an uneven surface 624, due to the presence of the plurality of structures 604 formed on the substrate 602. The initial step height (h) of the uneven surface 624 in the vicinity of the plurality of structures 604 is substantially equal to the height, or thickness (t), of the structures 604.

After the first material is deposited in FIG. 6(b), the improved process 600 and method 700 may use a chemical mechanical polishing (CMP) process (in step 630 of FIG. 6(c) and step 730 of FIG. 7) to planarize the uneven surface 624 of the first material layer 622 and provide the first material layer 622 with a locally planarized surface 632 above the plurality of structures 604. The CMP process may utilize a slurry containing a solvent, an abrasive grit and reactive chemicals designed to corrode the first material layer 622. The combination of surface reaction, and the action of the abrasive grit, removes material at elevated points on the uneven surface 624. At the beginning of the CMP process, the abrasive grit and reactive chemicals begin smoothing the uneven surface 624, which reduces the step height (h). In the illustrated embodiment, the CMP process continues until complete local planarization of the uneven surface 624 is achieved, as shown in FIG. 6(c).

After CMP is performed in FIG. 6(c), the improved process 600 and method 700 may use a wet etch process to etch the first material layer 622 (in step 640 of FIG. 6(d) and step 740 of FIG. 7). In the wet etch process shown in FIG. 6(d), the substrate 602 is exposed to an etch solution 642 that removes the first material deposited within the gaps 606 faster than the first material is removed from the surrounding areas of the substrate (e.g., the more planar area 608 of the substrate adjacent to the plurality of features 604). The improved process 600 and method 700 may continue etching the first material (in step 650 of FIG. 6(e) and step 750 of FIG. 7) until a uniform recess 652 is provided between the plurality of structures 604 and the first material layer 622 is provided with a uniform thickness (T) across the substrate 602.

The wet etch process shown in FIGS. 6(d) and 6(e) may use an aqueous-based etch solution or a non-aqueous organic-based etch solution to etch the first material layer 622, depending on the wall material used to form the plurality of structures 604. When the first material layer 622 is adjacent to a wall material (such as, e.g., a-Si, poly-Si, SiCN or SiON) that exhibits a negative surface potential when exposed to aqueous solutions in a given pH range, the wet etch process shown in FIGS. 6(d) and 6(e) may use a non-aqueous organic-based etch solution containing anions as the main reactive species to etch the first material layer 622. As described above with regard to FIGS. 1A and 2, a non-aqueous organic-based etch solution 130 containing anions as the main reactive species etches material faster within the gaps formed between a plurality of structures, and slower within surrounding areas of the substrate (e.g., more planar areas) outside of the plurality of structures, when the material being etched is adjacent to a negatively charged surface. Examples of non-aqueous organic-based etch solutions are described in more detail above.

When the first material layer 622 is adjacent to a wall material (such as SiN) that exhibits a positive surface potential when exposed to aqueous solutions in a given pH range, the wet etch process shown in FIGS. 6(d) and 6l may utilize a non-aqueous organic-based etch solution or an aqueous-based etch solution containing anions as the main reactive species to etch the first material layer 622. In some embodiments (not shown), non-aqueous organic-based etch solutions and aqueous-based etch solutions may both be capable of etching material faster within the gaps, and slower within the surrounding areas of the substrate (e.g., more planar areas) outside of the plurality of structures, when the material being etched is adjacent to a wall material that typically exhibit a positive surface potential (i.e., a positively charged surface) when exposed to aqueous solutions in a given pH range. Examples of non-aqueous organic-based etch solutions and aqueous-based etch solutions are described in more detail above.

In some embodiments, the etch solution 642 used to etch the first material layer 622 may depend on other factors, such as cost, safety, environmental concerns and compatibility with hardware parts, when the first material layer 622 is adjacent to a positively charged surface. In some embodiments, an aqueous-based etch solution may be used to etch the first material layer 622, due to the factors above. In other embodiments, a non-aqueous organic-based etch solution may be used to etch the first material layer 622 when the first material layer 622 is adjacent to a positively charged surface.

The above-mentioned etch solutions remove the first material deposited within the gaps 606 faster than the first material is removed from the surrounding areas of the substrate when: (a) the etch solution 642 contains anions as the main reactive species, and (b) the material being etched (e.g., the first material layer 622) is adjacent to a wall material that exhibits a negative surface charge when exposed to aqueous solutions of certain pH. However, the etch solution 642 is not strictly limited to the example etch solutions described above. When the etch solution 642 contains cations, instead of anions, as the main reactive species, an alternative etch solution 642 may be used to provide a faster etch rate within the gaps 606 than the surrounding areas of the substrate. For example, the etch solution 642 may alternatively include an aqueous-based etch solution containing cations as the main reactive species. In some embodiments, the pH of the etch solution 642 may be adjusted and/or a surfactant may be added to the etch solution 642 to change the surface potential of the wall material adjacent to the material being etched and provide the desired CD-dependent etch results.

Figure 8:
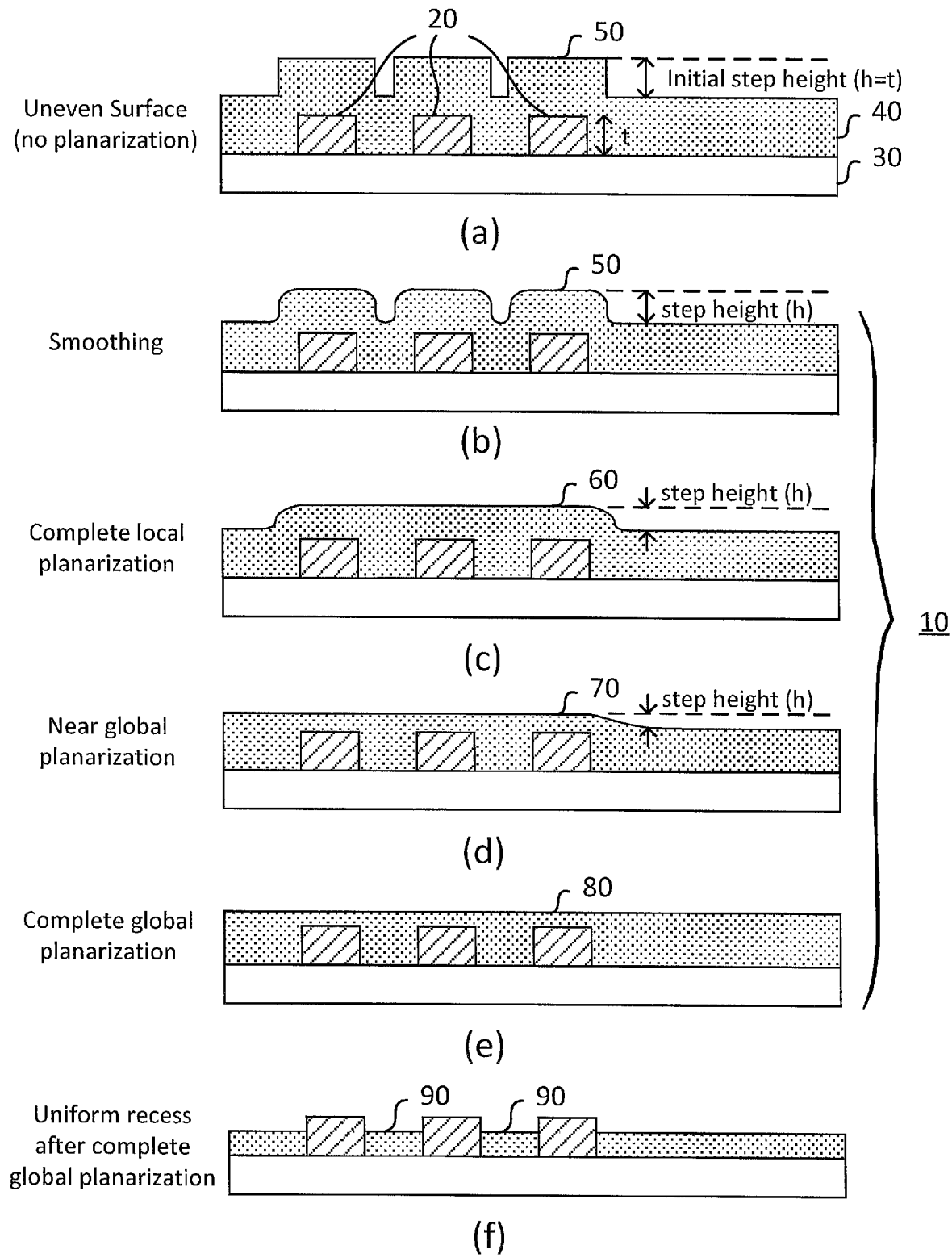
FIG. 8 illustrates a conventional chemical mechanical polish (CMP) process for planarizing an uneven surface of a material layer formed on a substrate.

Some applications may require a uniform recess 652 to be formed between the plurality of structures 604. As shown in FIG. 8, conventional methods for forming a uniform recess 90 between structures 20 may continue the CMP process 10 in an attempt to achieve complete global planarization 80 of an uneven surface 50 in step 8(e) before a dry etch or wet etch process is used in step 8(f) to form the uniform recess 90. Unfortunately, it is difficult to achieve complete global planarization 80 of an uneven surface 50 using CMP alone. Without complete global planarization 80, a subsequently performed etch process cannot be used to achieve a uniform recess 90 between structures 20, as shown in step (f) of FIG. 8.

The present disclosure improves upon conventional methods for forming uniform recesses between structures by providing an improved process 600 and method 700 that does not require complete global planarization of the uneven surface. In the present disclosure, CMP requirements are relaxed by stopping the CMP process as soon as the first material layer 622 is provided with a locally planarized surface 632, as shown in FIG. 6(c). After achieving local planarization of the uneven surface 624, a wet etch process is used in FIG. 6(d) to remove the first material deposited within the gaps 606 faster than the first material is removed from the surrounding areas of the substrate (e.g., the more planar area 608 of the substrate adjacent to the plurality of features 604). The wet etch process continues in FIG. 6(e) until a uniform recess 652 is provided between the plurality of structures 604 and the first material layer 622 is provided with a uniform thickness (T) across the substrate 602. By taking advantage of CD-depending etching within the gaps 606, the improved process provides a truly uniform recess 652, while relaxing the requirements of CMP.

Some applications may require complete global planarization of an uneven surface. However, complete global planarization is difficult to achieve with CMP alone.

The present disclosure improves upon conventional methods of planarization by utilizing a combination of CMP, wet etch and deposition processes to provide complete global planarization of an uneven surface. After forming a uniform recess 652 as shown in FIG. 6(e), the improved process 600 and method 700 may deposit a second material onto the first material layer 622, the plurality of structures 604 and within the gaps 606 formed between the plurality of structures 604 (in step 660 of FIG. 6(f) and step 760 of FIG. 7). The deposition step shown in FIG. 6(f) forms a second material layer 662 having an elevated surface 664 above the plurality of structures 604. A step height (h) of the elevated surface 664 may be substantially equal to the height, or thickness (ti), of the structures 604 that extend above the surface of the first material layer 622.

Like the first deposition step shown in FIG. 6(b), a wide variety of semiconductor processes and materials may be used to deposit the second material in the second deposition step shown in FIG. 6(f). For example, the second material may be an oxide material or a dielectric material, which is deposited by spin-on, chemical vapor deposition (CVD), physical vapor deposition (PVD), etc. In some embodiments, the first material and the second material may be the same material. In other embodiments, the first material and the second material may be different materials.

After the second material is deposited in FIG. 6(f), the improved process 600 and method 700 may utilize a second CMP process (in step 670 of FIG. 6(g) and step 770 of FIG. 7) to planarize the elevated surface 664 of the second material layer 662 and provide the second material layer 662 with a globally planarized surface 672. Like the initial CMP process, the second CMP process may utilize a slurry containing a solvent, an abrasive grit and reactive chemicals designed to corrode the second material layer 662. The second CMP process gradually removes material from the elevated surface 664, which reduces the step height (h), until complete global planarization is achieved, as shown in FIG. 6(g).

Improved processes and methods for planarizing an uneven surface of a material layer formed on a substrate are described in various embodiments. In the disclosed embodiments, a wet etch process is utilized after achieving complete local planarization of the uneven surface. The wet etch process may utilize a non-aqueous organic-based etch solution 130 and the aqueous-based etch solution 140, as described above. In the example embodiments shown in FIGS. 1A-1B and 6(d)-6(e), the etchant chemical utilized within the non-aqueous organic-based etch solution 130 and the aqueous-based etch solution 140 includes an anion (negatively charged ion) as the main reactive species.

In alternative embodiments of the present disclosure (not illustrated), the etchant chemical utilized within the non-aqueous organic-based etch solution 130 and the aqueous-based etch solution 140 may contain a cation (positively charged ion) as the main reactive species. When a cation is used as the main reactive species, the non-aqueous organic-based etch solution 130 and the aqueous-based etch solution 140 may provide an etching effect, which is opposite to that which is shown in FIGS. 1A-1B and 6(d)-6(e). For example, when a cation is used as the main reactive species, the non-aqueous organic-based etch solution 130 may etch the material 125 slower in features having smaller CD (such as feature 115a) and faster in features having larger CD (such as feature 115b). Likewise, when a cation is used as the main reactive species, the aqueous-based etch solution 140 may etch the material 125 faster in features having smaller CD (such as feature 115a) and slower in features having larger CD (such as feature 115b).

The term "substrate" as used herein means and includes a base material or construction upon which materials are formed. The substrate may include any material portion or structure of a device (particularly a semiconductor or other electronics device), and may, for example, be a base substrate structure (such as a semiconductor substrate) or a layer on or overlying a base substrate structure (such as a thin film). Thus, the term "substrate" is not intended to be limited to any particular base structure, underlying layer or overlying layer, patterned layer or unpatterned layer. Rather, the term "substrate" is contemplated to include any such layer or base structure, and any combination of layers and/or base structures.

It will be appreciated that the substrate described herein may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments described herein may be practiced without one or more of the specific details, or with other replacement and/or additional methods, materials or components. In other instances, well-known structures, materials or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the processes and methods described herein will be apparent to those skilled in the art in view of this description. It will be recognized, therefore, that the described processes and methods are not limited by the examples described herein. It is to be understood that the forms of the processes and methods described herein are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to form uniform recesses between a plurality of structures formed on a substrate, the method comprising:
    providing the substrate having a plurality of structures formed thereon, wherein the plurality of structures extend above a surface of the substrate, wherein the plurality of structures are each separated by a gap, and wherein a critical dimension (CD) of the gap is small compared to surrounding areas of the substrate;
    depositing a material onto a surface of the substrate, the plurality of structures and within the gaps formed between the plurality of structures, wherein said depositing forms a material layer with an uneven surface;
    planarizing the uneven surface of the material layer with a chemical mechanical polishing (CMP) process to provide the material layer with a locally planarized surface above the plurality of structures;
    etching the material layer with an etch solution after said planarizing, wherein said etching removes the material deposited within the gaps faster than the material is removed from the surrounding areas of the substrate, wherein a wall material of the plurality of structures exhibits a negative surface potential when exposed to aqueous solutions in a given pH range, and wherein said etching comprises etching the material layer with a non-aqueous organic-based etch solution that includes one or more etchant chemicals and an organic solvent; and
    continuing said etching until a uniform recess is formed between the plurality of structures and the material layer is provided with a uniform thickness across the substrate.

2. The method of claim 1, wherein said depositing comprises depositing an oxide material or a dielectric material onto the surface of the substrate, the plurality of structures and within the gaps formed between the plurality of structures.

3. The method of claim 1, wherein the wall material comprises amorphous silicon (a-Si), polysilicon (poly-Si), silicon carbon nitride (SiCN) or silicon oxynitride (SiON).

4. The method of claim 1, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

5. The method of claim 1, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

6. A method to form uniform recesses between a plurality of structures formed on a substrate, the method comprising:
    providing the substrate having a plurality of structures formed thereon, wherein the plurality of structures extend above a surface of the substrate, wherein the plurality of structures are each separated by a gap, and wherein a critical dimension (CD) of the gap is small compared to surrounding areas of the substrate;
    depositing a material onto a surface of the substrate, the plurality of structures and within the gaps formed between the plurality of structures, wherein said depositing forms a material layer with an uneven surface;
    planarizing the uneven surface of the material layer with a chemical mechanical polishing (CMP) process to provide the material layer with a locally planarized surface above the plurality of structures;
    etching the material layer with an etch solution after said planarizing, wherein said etching removes the material deposited within the gaps faster than the material is removed from the surrounding areas of the substrate, wherein a wall material of the plurality of structures exhibits a positive surface potential when exposed to aqueous solutions in a given pH range, and wherein said etching comprises etching the material layer with an aqueous-based etch solution that includes one or more etchant chemicals and an aqueous solvent; and
    continuing said etching until a uniform recess is formed between the plurality of structures and the material layer is provided with a uniform thickness across the substrate.

7. The method of claim 6, wherein the wall material comprises silicon nitride (SiN).

8. The method of claim 6, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), and wherein the aqueous solvent is water.

9. The method of claim 6, wherein said depositing comprises depositing an oxide material or a dielectric material onto the surface of the substrate, the plurality of structures and within the gaps formed between the plurality of structures.

10. A method for planarizing a substrate, the method comprising:
provining a substrate having a plurality of structures formed thereon, wherein the plurality of structures extend above a surface of the substrate, wherein the plurality of structures are each separated by a gap, and wherein a critical dimension (CD) of the gap is small compared to surrounding areas of the substrate;
depositing a first material onto a surface of the substrate, the plurality of structures and within the gaps formed between the plurality of structures, wherein said depositing forms a first material layer with an uneven surface;
planarizing the uneven surface of the first material layer with a chemical mechanical polishing (CMP) process to provide the first material layer with a locally planarized surface above the plurality of structures;
etching the first material layer with an etch solution after said planarizing, wherein said etching removes the first material deposited within the gaps faster than the first material is removed from the surrounding areas of the substrate;
continuing said etching until a uniform recess is provided between the plurality of structures and the first material layer is provided with a uniform thickness across the substrate;
depositing a second material onto the first material layer, the plurality of structures and within the gaps formed between the plurality of structures, wherein said depositing forms a second material layer with an elevated surface above the plurality of structures; and
planarizing the elevated surface of the second material layer with a chemical mechanical polishing (CMP) process to provide the second material layer with a globally planarized surface.

11. The method of claim 10, wherein said depositing the first material comprises depositing an oxide material or a dielectric material onto the surface of the substrate, the plurality of structures and within the gaps formed between the plurality of structures.

12. The method of claim 10, wherein said depositing the second material comprises depositing an oxide material or a dielectric material onto the first material layer, the plurality of structures and within the gaps formed between the plurality of structures.

13. The method of claim 10, wherein the second material is the same as the first material.

14. The method of claim 10, wherein the first material and the second material are different.

15. The method of claim 10, wherein a wall material of the plurality of structures exhibits a negative surface potential when exposed to aqueous solutions in a given pH range, and wherein said etching comprises etching the first material layer with a non-aqueous organic-based etch solution that includes one or more etchant chemicals and an organic solvent.

16. The method of claim 15, wherein the wall material comprises amorphous silicon (a-Si), polysilicon (poly-Si), silicon carbon nitride (SiCN) or silicon oxynitride (SiON).

17. The method of claim 15, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

18. The method of claim 15, wherein the organic solvent is selected from a group consisting of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

19. The method of claim 10, wherein a wall material of the plurality of structures exhibits a positive surface potential in aqueous solutions having a given pH range, and wherein said etching comprises etching the first material layer with an aqueous-based etch solution that includes one or more etchant chemicals and an aqueous solvent.

20. The method of claim 19, wherein the wall material comprises silicon nitride (SiN).

21. The method of claim 19, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), and wherein the aqueous solvent is water.

* * * * *